United States Patent [19]

Suwa

[11] Patent Number: 4,533,976
[45] Date of Patent: Aug. 6, 1985

[54] ELECTRONIC UNIT
[75] Inventor: Kaname Suwa, Yokohama, Japan
[73] Assignee: Canon Kabushiki Kaisha, Tokyo, Japan
[21] Appl. No.: 449,503
[22] Filed: Dec. 13, 1982
[30] Foreign Application Priority Data
Dec. 24, 1981 [JP] Japan ............................... 56-208036
[51] Int. Cl.³ ............................................. H05K 1/14
[52] U.S. Cl. .................................. 361/395; 206/328; 339/17 M; 361/394; 361/413; 361/415
[58] Field of Search ............... 361/394, 395, 412, 413, 361/415; 206/328; 339/17 M, 17 LD
[56] References Cited
U.S. PATENT DOCUMENTS 3,173,732  3/1965  James ............................... 361/413 X
3,376,479  4/1968  Wines et al. ......................... 361/395
3,447,037  5/1969  Nissim ............................. 361/415 X
3,529,213  9/1970  Farrand et al. ...................... 361/394
3,805,117  4/1974  Hausmann ....................... 361/412 X
3,858,958  1/1975  Davies ............................. 361/413 X
4,061,228  12/1977  Johnson .......................... 361/415 X
4,124,878  11/1978  Ebner et al. ........................ 361/415
4,295,700  10/1981  Sado ............................... 361/413 X Primary Examiner—R. R. Kucia
Attorney, Agent, or Firm—Fitzpatrick, Cella, Harper & Scinto

[57] ABSTRACT

Printed circuit boards each having an electronic component packaged thereon are stacked in a casing with conductive elastic members being interleaved therebetween and an opening of the casing is closed by a cover so that the printed circuit boards are urged against the casing and electrically connected to each other.

12 Claims, 3 Drawing Figures

ELECTRONIC UNIT

BACKGROUND OF THE INVENTION

1. Field of the Invention

The present invention relates to an electronic unit such as a ROM pack for use in an electronic teaching machine, an electronic translating machine or an electronic desk-top calculator.

2. Description of the Prior Art

A prior art electronic unit such as a ROM pack is usually constructed in a following manner. A plurality of printed circuit boards having elements such as LSI chips packaged thereon are stacked in an outer casing and the printed circuit boards are interconnected by flexible cables, or a flexible printed circuit board is folded and rigid substrates are backed at mounting areas of the elements such as LSI chips and the printed circuit board is housed in an outer casing.

However, in such a prior art ROM pack, the interconnection of the printed circuit boards or the backing of the rigid substrates is troublesome work and hence the assembling work is time-consuming. In addition, since the components cannot be readily removed because of the structure, exchange of components in case of trouble is troublesome. Furthermore, since expensive components must be used, the cost is high.

SUMMARY OF THE INVENTION

It is an object of the present invention to provide an electronic unit of a novel structure.

It is another object of the present invention to provide an electronic unit which is simple to assemble.

It is another object of the present invention to provide an electronic unit which is easy to exchange components.

It is another object of the present invention to provide an electronic unit which is simple in construction.

It is another object of the present invention to provide a low cost electronic unit.

The above and other objects of the present invention will be apparent from the following description.

DETAILED DESCRIPTION OF THE PREFERRED EMBODIMENT

Figure 1:
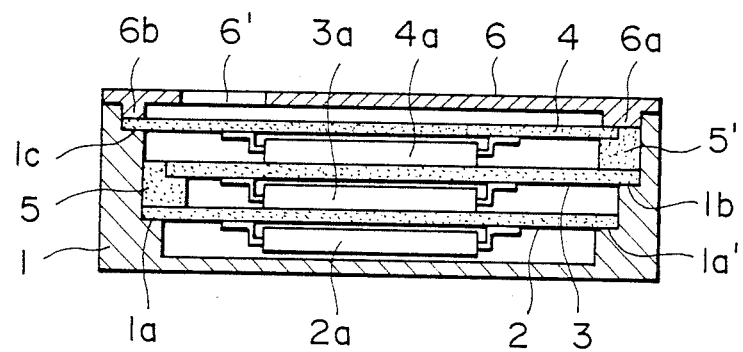
FIG. 1 shows a sectional view of a ROM pack in accordance with one embodiment of the present invention.
Figure 2:
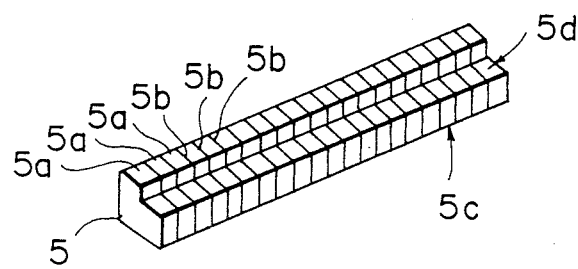
FIG. 2 shows a perspective view of a conductive elastic member used in the ROM pack.
Figure 3:
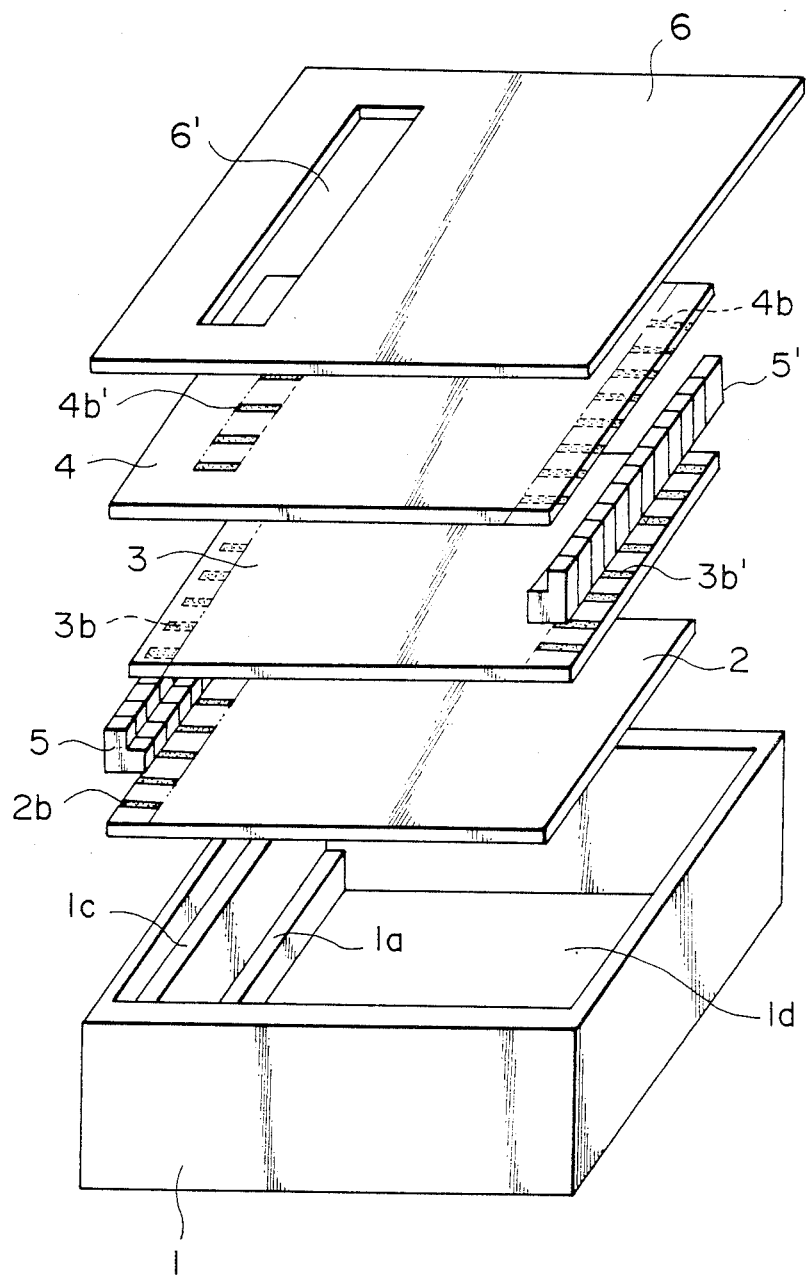
FIG. 3 shows a developed perspective view of the ROM pack of the embodiment of FIG. 1.

FIG. 1 shows a sectional view of a structure of a ROM pack in accordance with one embodiment of the invention. FIG. 2 shows a perspective view of zebra connector used in the ROM pack and FIG. 3 shows a developed perspective view of the ROM pack.

Numeral 1 denotes an outer casing of the ROM pack made of non-conductive material such as plastic. Steps 1a, 1a', 1b and 1c for supporting printed circuit boards 2, 3 and 4 are formed in the casing 1 and an opening 1d through which the printed circuit boards 2, 3 and 4 are inserted is formed. The steps 1a and 1a' are of the same height, the step 1b is located thereabove and the step 1c is located above step 1b on opposite sides of the casing 1. The printed circuit boards 2, 3 and 4 are conventional rigid boards made of paper phenol or glass epoxy. On the lowermost printed circuit board 2, an electronic part or a ROM chip 2a is mounted and the opposite ends of the printed circuit board 2 are held by the steps 1a and 1a' of the casing 1. On the second printed circuit board 3, a ROM chip 3a is mounted and one end of the printed circuit board 3 is held by the step 1b of the casing 1 while the other end is held on a conductive elastic member 5 disposed on one end of the casing 1 above the step 1a.

The conductive elastic member 5 is made of elastic material such as silicone rubber and has insulative layers 5a and conductive layers 5b stacked alternately to form a zebra conductive connector as shown in FIG. 2. The conductive elastic members 5 and 5' (to be described later) each have a longitudinal cut-away portion which is to engage with and hold one end of the printed circuit board. Thus, they have generally L-shaped sections as shown in FIG. 2.

The conductive layers 5b on a bottom surface 5c of the conductive elastic member 5 abut against a connecting pattern 2b formed on an upper surface of the printed circuit board 2 and the conductive layers 5b on a lower stepped surface 5d abut against a connecting pattern 3b formed on a lower surface of the printed circuit board 3. As a result, the printed circuit boards 2 and 3 are electrically connected through the conductive elastic member 5 and one end of the printed circuit board 3 is held by the lower stepped surface 5d of the conductive elastic member 5.

As a result of selecting the pitch of the conductive layers 5b of the conductive elastic member 5 to be sufficiently smaller than pitches of the connecting patterns 2b and 3b on the printed circuit boards 2 and 3 and positioning the printed circuit boards 2 and 3 within the casing 1 such that the connecting patterns 2b and 3b are vertically aligned, it is not necessary to position the conductive elastic member 5 relative to the connecting patterns 2b and 3b and hence the assembly work is facilitated.

A ROM chip 4a is mounted on a third printed circuit board 4, and one end of the printed circuit board 4 is held by the step 1c of the casing 1 while the other end is held on the conductive elastic member 5' disposed on the printed circuit board 4. The conductive elastic member 5' is of the same structure as the conductive elastic member 5 and disposed between a connecting pattern 3b' on the upper surface of the printed circuit board 3 and a connecting pattern 4b on a lower surface of the printed circuit board 4 to electrically connect the printed circuit boards 3 and 4. By selecting a pitch of the conductive layers of the conductive elastic member 5' to be sufficiently smaller than the pitches of the connecting patterns 3b' and 4b and positioning the printed circuit boards 3 and 4 such that the connecting patterns 3b' and 4b are vertically aligned, the assembly work is facilitated as is done by the conductive elastic member 5 as described above.

A cover 6 made of non-conductive material such as plastic is fitted to the opening 1d above the printed circuit board 4. The opposite ends of the printed circuit board 4 are urged against the step 1c and the conductive elastic member 5' by projections 6a and 6b of the cover 6. As a result, the connecting pattern 4b on the lower surface of the printed circuit board 4 press-contacts to the conductive elastic member 5' and the conductive elastic member 5' press-contacts to the connecting pattern 3b' on the upper surface of the printed circuit board 3. As a result, the end of the printed circuit board 3 on the side of the connecting pattern 3b' is urged against the step 1b of the casing 1. The ROM chip 4a of the printed circuit board 4 urges the upper surface of the printed circuit 3. As a result, the connecting pattern 3b of the printed circuit board 3 press-contacts to the conductive elastic member 5 and the conductive elastic member 5 press-contacts to the connecting pattern 2b of the printed circuit board 2. The end of the printed circuit board 2 is urged against the steps 1a and 1a' by the press-contact of the conductive elastic member 5 and the press-contact of the ROM chip 3a on the printed circuit board 3.

In this manner, the printed circuit boards 2 and 3 and the printed circuit boards 3 and 4 are electrically connected respectively, and the printed circuit boards 2, 3 and 4 are stably fixed to the outer casing 1 to form the ROM pack.

In the present embodiment, the length of the printed circuit board 4 is different from the length of the printed circuit boards 2 and 3 because the casing 1 has steps which are wide as they go toward the opening 1d. When the conductive elastic members 5 and 5' are of rectangular shape, the lengths of the printed circuit boards 2, 3 and 4 increase in this order. The different lengths of the printed circuit boards provide a significant advantage in packaging because the correct sequence of inserting the printed circuit boards is assured.

In the present embodiment, the electronic parts or the ROM chips 3a and 4a press the non-pattern areas of the printed circuit boards 2 and 3. As a result, members for pressing the printed circuit boards can be omitted.

In the present embodiment, the conductive elastic members 5 and 5' have generally L-shaped sections. As a result, variations of the printed circuit boards can be absorbed by the elastic members 5 and 5' so that the printed circuit boards are more securely held.

A window 6' is formed in the cover 6 and external connecting terminals 4b' for connection with a main unit of an electronic equipment are formed on the upper surface of the printed circuit board 4 at a position facing the window 6'.

While three printed circuit boards are used in the present embodiment, it should be understood that the present invention is applicable to a ROM pack having four or more printed circuit boards. The conductive elastic members 5 and 5' are not limited to the silicone rubber zebra connectors.

As described hereinabove, according to the present invention, the printed circuit boards and the conductive elastic members are stacked in the casing having the steps. Accordingly, the assembling work is very simple. Since the printed circuit boards and the conductive elastic members are separable, the exchange of parts in case of trouble is readily carried out. In addition, since inexpensive parts may be used because of the structure, the cost of the parts can be reduced.

What I claim is:

1. An electronic package containing circuit boards, said package comprising:
    a plurality of printed circuit boards each having connecting patterns;
    a casing having an opening for inserting said printed circuit boards;
    conductive and elastic connecting means each disposed at the position corresponding to said connecting patterns between respective ones of said printed circuit boards and electrically connecting said printed circuit boards; and
    a cover for closing said opening of said casing to press said printed circuit boards in said casing to secure said printed circuit boards to said casing and electrically connect said printed circuit boards, and having a window portion at a position facing said connecting patterns for connection to an external piece of equipment.

2. An electronic package according to claim 1, wherein said casing has an internal contour having steps which are wider as they go toward said opening.

3. An electronic package according to claim 1, wherein at least some of said printed circuit boards each have a respective electronic component package thereon and wherein said electronic components packaged on said printed circuit boards contact adjacent printed circuit boards.

4. An electronic package according to claim 1, wherein said connecting means each have a cut-away portion to engage with and hold an end of said printed circuit board such that said connecting means has an L-shaped section.

5. An electronic package according to claim 1, wherein said connecting means are each disposed between adjacent ones of said printed circuit boards.

6. An electronic package according to claim 3, wherein said connecting means are each disposed between adjacent ones of said printed circuit boards.

7. An electronic package containing circuit boards, said package comprising:
    a plurality of printed circuit boards each having connecting patterns;
    a casing having an opening receiving said printed circuit boards and having an internal contour having steps which are progressively wider according as they are located progressively nearer to said opening, said printed circuit boards being disposed in said casing on said step;
    connecting means electrically connecting said printed circuit boards to each other in said casing; and
    a cover for closing said opening of said casing and having a window portion at a position facing said connecting patterns for connection to an external piece of equipment.

8. An electronic package containing circuit boards, said package comprising:
    a plurality of printed circuit boards each having connection patterns;
    a casing having an opening for receiving said printed circuit boards, said opening having a contour defining a first step which receives a first one of said printed circuit boards, a second step defined at one side of said casing and receiving one edge of a second of said printed circuit boards and a third step defined at a second side of said casing opposite to said first side in a direction parallel to said first and second printed circuit boards, said thrid step receiving an edge of a third one of said printed circuit boards;
    at least first and second conductive and elastic connecting means each disposed at a position corresponding to said connecting patterns between respective ones of said printed circuit boards and electrically connecting said printed circuit boards to each other, said first connecting means being disposed at said second side of said casing and electrically connecting said first and second printed circuit boards, and holding an edge of said second printed circuit board, and said second connecting means being disposed at said first side of said casing and electrically connecting said second and third printed circuit boards, and holding an edge of said third printed circuit boards; and a cover for closing said opening of said casing to hold said printed circuit boards in said casing and for pressing said printed circuit boards into place therein.

9. An electronic package according to claim 8, wherein at least one of said printed circuit boards has a electronic component which is packaged thereon and which contacts an adjacent one of said printed circuit board.

10. An electronic package according to claim 8, wherein each said connecting means has a cut-away portion engaging and holding said respective edge of the respective said printed circuit board, such that said connecting means each have an L-shaped section.

11. An electronic package according to claim 8, wherein said printed circuit boards are arranged in said casing in such a manner as to define a stack of printed circuit boards, each of said printed circuit boards having an edge located at said one side of said casing and having another edge located at said second side of said casing, said printed circuit boards being generally parallel to each other inside said casing and said cover being generally parallel to said printed circuit boards; and wherein said cover includes at least portions engaging one of said printed circuit boards which is nearest to said cover, resiliently pressing that printed circuit board into said casing.

12. An electronic package according to claim 11, wherein said cover has a window portion at a position facing said connecting patterns of said printed circuit board closest to said cover for connection to an external piece of equipment.

* * * * *

UNITED STATES PATENT AND TRADEMARK OFFICE
CERTIFICATE OF CORRECTION

PATENT NO. : 4,533,976

DATED : August 6, 1985

INVENTOR(S) : KANAME SUWA

It is certified that error appears in the above-identified patent and that said Letters Patent is hereby corrected as shown below:

Column 1: line 57, after "of" insert --a--.

Column 4: line 58, change "thrid" to --third--.

Column 5: line 14, change "a" to --an--.

Signed and Sealed this

Fourth Day of February 1986

[SEAL]

Attest:

DONALD J. QUIGG

Attesting Officer

Commissioner of Patents and Trademarks